(12) United States Patent
Machefaux et al.

(10) Patent No.: US 12,724,937 B2
(45) Date of Patent: Sep. 1, 2026

(54) WIND FARM BLOCKAGE

(71) Applicant: VESTAS WIND SYSTEMS A/S, Aarhus N. (DK)

(72) Inventors: Ewan Machefaux, Tune (DK); Juan Pablo Murcia, København N (DK)

(73) Assignee: VESTAS WIND SYSTEMS A/S, Aarhus N (DK)

( * ) Notice: Subject to any disclaimer, the term of this patent is extended or adjusted under 35 U.S.C. 154(b) by 493 days.

(21) Appl. No.: 17/787,017

(22) PCT Filed: Dec. 16, 2020

(86) PCT No.: PCT/DK2020/050370
§ 371 (c)(1),
(2) Date: Jun. 17, 2022

(87) PCT Pub. No.: WO2021/121510
PCT Pub. Date: Jun. 24, 2021

(65) Prior Publication Data
US 2023/0086699 A1 Mar. 23, 2023

(30) Foreign Application Priority Data
Dec. 17, 2019 (DK) .......................... PA 2019 70779

(51) Int. Cl.
*G06F 30/20* (2020.01)
*F03D 80/00* (2016.01)

(52) U.S. Cl.
CPC ............ *G06F 30/20* (2020.01); *F03D 80/00* (2016.05); *F05B 2260/84* (2013.01)

(58) Field of Classification Search
CPC .... F03D 80/00; F03D 80/002; F05B 2260/84; F05B 2270/204
See application file for complete search history.

(56) References Cited

U.S. PATENT DOCUMENTS

2010/0080703 A1* 4/2010 Chen ...................... F03D 17/00 416/61
2010/0138201 A1* 6/2010 Gundling ............... F03D 7/026 703/9

(Continued)

FOREIGN PATENT DOCUMENTS

CN 108520319 A 9/2018
EP 3249218 A1 11/2017
WO 2021121510 A1 6/2021

OTHER PUBLICATIONS

Danish Patent and Trademark Office, 1st Technical Examination Including The Search Report and Search Opinion for Application PA 2019 70779 dated Jul. 1, 2020.

(Continued)

*Primary Examiner* — Nathaniel E Wiehe
*Assistant Examiner* — Aye S Htay
(74) *Attorney, Agent, or Firm* — Patterson + Sheridan, LLP; Gero G. McClellan

(57) ABSTRACT

Aspects of the present invention relate to a method for determining annual energy production of a wind farm. The method comprises: receiving a definition of the wind farm; modelling the wind field of the wind farm for a plurality of freestream wind speeds in a plurality of wind directions; defining locations for virtual measurement masts upstream of upstream turbines in each wind direction at a clearance from each upstream turbine for identifying wind farm blockage effects; determining a wind farm blockage factor for each freestream wind speed in each wind direction based on data from the virtual measurement masts; receiving measurements from a physical measurement mast located at the site of the wind farm; and determining an annual energy production for the wind farm based on adjusted wind speeds obtained by applying the blockage factors to measurements from the physical measurement mast.

18 Claims, 9 Drawing Sheets

(56) References Cited

U.S. PATENT DOCUMENTS

| | | | | |
|---|---|---|---|---|
| 2011/0208483 | A1 | 8/2011 | Dilkina et al. | |
| 2014/0039843 | A1 * | 2/2014 | Hazra | G06F 30/13 703/1 |
| 2015/0278405 | A1 * | 10/2015 | Andersen | G06Q 10/06375 703/18 |
| 2016/0171401 | A1 | 6/2016 | Wu et al. | |
| 2019/0345916 | A1 * | 11/2019 | Stephen | F03D 7/0224 |
| 2021/0190040 | A1 * | 6/2021 | Bott | F03D 17/00 |

OTHER PUBLICATIONS

PCT, Notification of Transmittal of The International Search Report and The Written Opinion of The International Searching Authority, or The Declaration for Application PCT/DK2020/050370 dated Mar. 5, 2021.

Brogna Roberto et al: A new wake model and comparison of eight algorithms for layout optimization of wind farms in complex terrain Applied Energy, Elsevier Science Publishers, GB, vol. 259, Nov. 30, 2019 (Nov. 30, 2019).

Porte-Agel Fernando et al: Wind-Turbine and Wind-Farm Flows: A Review, Boundary Layer Meteorology, Reidel, Dordrecht, NL, vol. 174, No. 1, Sep. 20, 2019 (Sep. 20, 2019), pp. 1-59.

Meyer Forsting AR et al: The effect of blockage on power production for laterally aligned wind turbines, Journal of Physics: Conference Series, Institute of Physics Publishing, Bristol, GB, vol. 625, No. 1, Jun. 18, 2015 (Jun. 18, 2015), p. 12029.

Bleeg James et al: 11Wi nd Farm Blockage and the Consequences of Neglecting Its Impact on Energy Production, Energies, vol. 11, No. 6, Jun. 20, 2018 (Jun. 20, 2018), p. 1609.

* cited by examiner 10.0D
Wind speed [m/s]
Wind direction [deg]

5.0D
Wind speed [m/s]
Wind direction [deg]

3.0D
Wind speed [m/s]
Wind direction [deg]

2.5D
Wind speed [m/s]
Wind direction [deg]

2.0D
Wind speed [m/s]
Wind direction [deg]

WIND FARM BLOCKAGE

TECHNICAL FIELD

The present disclosure relates to methods for determining annual energy production of wind farms, and particularly to the use of modelling to quantify and account for wind farm blockage for use in determining annual energy production.

BACKGROUND

Understanding the energy production of a wind farm, comprising a plurality of wind turbines, is important in ensuring that the wind farm is as efficient as possible, as well as providing assurances that energy requirements will be met by the wind farm. In order to determine energy production of a wind farm, the effects of wind on the individual turbines and the wind farm as a whole in different directions and at different speeds needs to be considered.

Conventionally, when modelling wind farms, a wakes-only approach has been taken, simulating the downstream effects of air flow on the turbines only. Therefore, analysis to determine the energy production of a wind farm often does not account for lateral or upstream effects of turbines, leading to an inaccurate determination.

There are two important lateral and upstream effects to consider in wind farms. The first is individual turbine blockage, also referred to as turbine induction, which is the displacement of air away from each turbine by the movement of the blades of the turbine. The turbine blockage leads to the velocity of air passing the rotor plane to be smaller than the free stream velocity. Turbine blockage is an important effect that is taken into account in some more recent simulations.

The second effect is wind farm blockage. Wind farm blockage is a phenomenon that has only been observed relatively recently and is an important consideration in the performance of the wind farm as a whole. Wind farm blockage, which is discussed at length in the paper '*Wind Farm Blockage and the Consequences of Neglecting its Impact on Energy Production*', Bleeg et al., Energies 2018, 11, 1609, is an effect felt upstream of a wind farm, whereby the flow velocity upstream of a wind farm is lower than the free stream velocity around an individual turbine. Wind farm blockage is a separate phenomenon to turbine blockage, being caused by the farm as a whole rather than individual turbines.

Without adequate quantification, the unseen effects of wind farm blockage result in inaccurate estimation of expected wind farm energy output. Furthermore, without an understanding of the effects of wind farm blockage, wind farms cannot be designed to maximise energy production and to avoid wind farm blockage.

It is an aim of the present invention to address one or more of the disadvantages associated with the prior art.

SUMMARY OF THE INVENTION

According to an aspect of the present invention there is provided a method for determining annual energy production of a proposed wind farm. The method comprises: receiving a definition of the wind farm, the definition including at least a layout of a plurality of wind turbines of the wind farm at a predetermined site and rotor size of each of the plurality of wind turbines; modelling the wind field of the wind farm for each of a plurality of freestream wind speeds in each of a plurality of wind directions; defining locations for a plurality of virtual measurement masts upstream of upstream turbines in each of the plurality of wind directions, wherein the upstream turbines are defined relative to the wind direction and the locations are defined at a clearance from each upstream turbine for identifying wind farm blockage effects; determining a wind farm blockage factor for each of the plurality of freestream wind speeds in each of the plurality of wind directions; the wind farm blockage factor being based on wind speed data from the virtual measurement masts located in the modelled wind field at the locations defined for the wind direction; receiving a plurality of measurements indicating wind speed and wind direction from at least one physical measurement mast located at the site of the wind farm; and determining an annual energy production for the wind farm based on one or more adjusted wind speeds obtained by applying one or more determined wind farm blockage factors to one or more measurements from the at least one physical measurement mast.

The use of virtual measurement masts upstream of the upstream turbines at a defined clearance ensures that wind farm blockage effects can be adequately taken into account when determining the annual energy production. By innovatively combining virtual mast measurements made for wind farm blockage with actual mast measurements for subsequent use in an AEP determination process, the AEP can be determined much more accurately than was previously possible in methods that did not take wind farm blockage into account.

The clearance from each upstream turbine may be a predetermined value. Alternatively, the clearance from each upstream turbine may be based on the diameter of the rotor of the upstream turbine. The clearance from each upstream turbine may be 1, 1.5, 2, 2.5, or 3 times the diameter of the rotor of the upstream turbine. Setting a clearance is useful in ensuring that wind farm blockage effects and wind turbine blockage effects are distinguished and are considered only once when adjusting wind speed measurements from physical measurement masts.

In another alternative, the method may comprise modelling the wind field of each upstream turbine separately from the other turbines of the wind farm for each of the plurality of freestream wind speeds in each of the plurality of wind directions, wherein the clearance from each upstream turbine of the wind farm for identifying wind farm blockage effects is based on the modelled wind field of each upstream turbine. The method may comprise determining, from the modelled wind field of each upstream turbine, a position upstream of the upstream turbine at which the wind speed is within a predetermined threshold of the freestream wind speed, wherein the clearance is the distance from the position to the upstream turbine. The method may comprise modelling the wakes of the wind farm for each of the plurality of freestream wind speeds in each of the plurality of wind directions, and wherein the upstream turbines are determined as the turbines in the farm whose incident wind speed is the freestream wind speed. In modelling the turbine wind fields, turbine blockage or turbine induction effects can be considered so that an accurate determination of a minimum clearance can be determined, consequently providing a more accurate AEP determination.

Defining locations for a plurality of virtual measurement masts may comprise: generating a line upstream of the upstream turbines at the determined clearances, the line extending between the outermost upstream turbines; and defining the locations along the generated line. The method may further comprise modelling the wakes of the wind farm for each of the plurality of freestream wind speeds in each of the plurality of wind directions. Generating the line may comprise: generating a convex hull at a predetermined clearance from the upstream turbines, the predetermined clearance being a clearance outside which no wind farm blockage effects are expected to occur; generating a concave hull surrounding the upstream turbines and the modelled wakes of the wind farm, the concave hull being spaced at the determined clearances from the upstream turbines and a predetermined distance from the wakes of the wind farm; and defining the line as the part of the concave hull that is within the convex hull. The locations may be defined at regular intervals along the line.

Determining the wind farm blockage factor may comprise determining an average wind speed reduction for the wind direction and wind speed. The blockage factor may be based on the average wind speed reduction.

The average wind speed reduction may be determined by calculating a reduction in the wind speed between the freestream and measured wind speeds at the position of each of the virtual measurement masts and determining the average wind speed reduction based on the calculated reductions.

Determining an average wind speed reduction may comprise applying a weighting to each reduction based on the proximity of the virtual measurement mast to a nearest turbine. The nearest turbine may comprise the nearest upstream turbine that is downstream of the virtual measurement mast.

The wind speed data from the virtual measurement masts may comprise at least one of: point measurement data obtained at each location and measurement data averaged over one or more surfaces associated with the locations.

Within the scope of this application it is expressly intended that the various aspects, embodiments, examples and alternatives set out in the preceding paragraphs, in the claims and/or in the following description and drawings, and in particular the individual features thereof, may be taken independently or in any combination. That is, all embodiments and/or features of any embodiment can be combined in any way and/or combination, unless such features are incompatible. The applicant reserves the right to change any originally filed claim or file any new claim accordingly, including the right to amend any originally filed claim to depend from and/or incorporate any feature of any other claim although not originally claimed in that manner.

BRIEF DESCRIPTION OF THE DRAWINGS

One or more embodiments of the invention will now be described, by way of example only, with reference to the accompanying drawings, in which.

DETAILED DESCRIPTION

Figure 1:
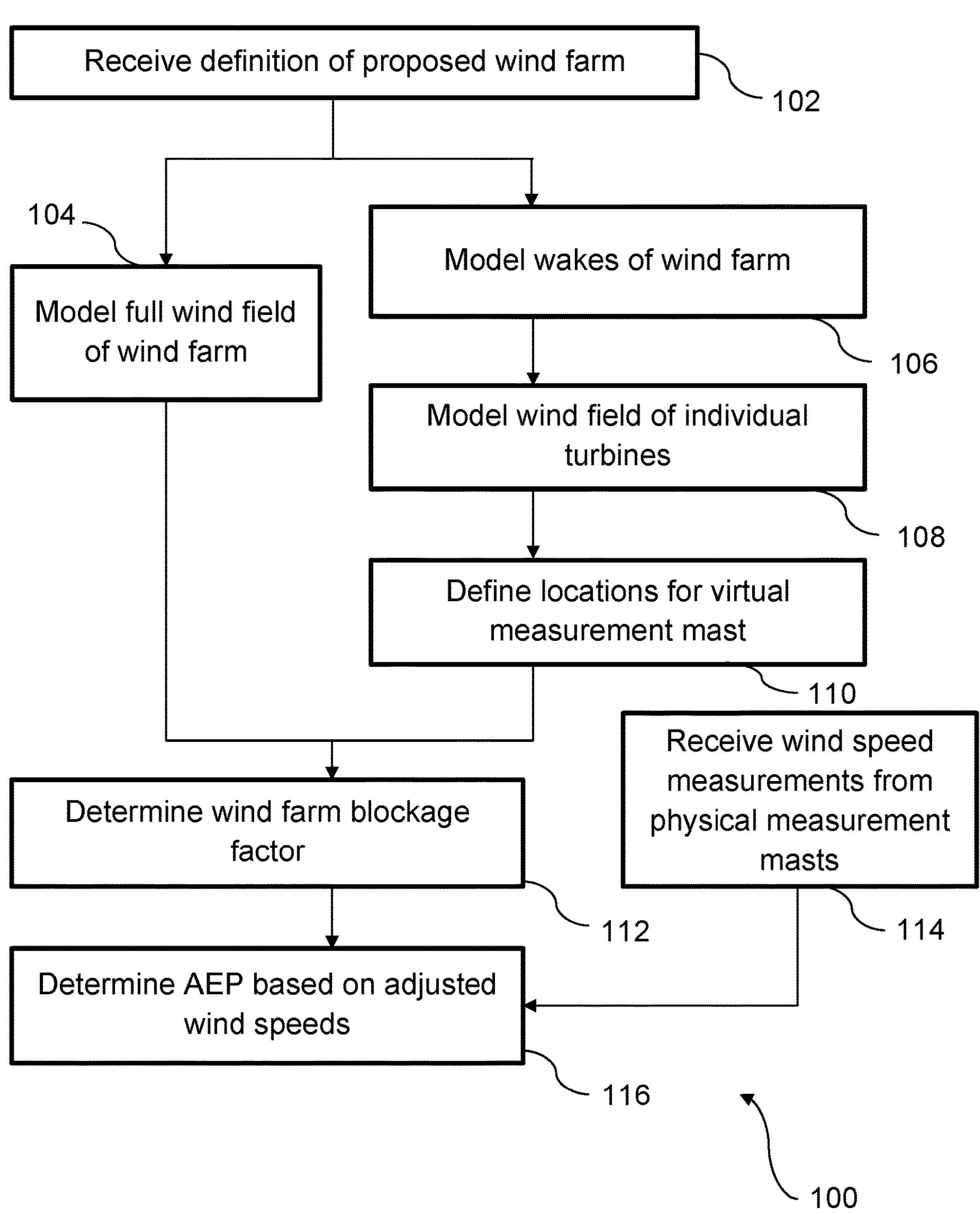
FIG. 1 shows a flow chart of a method for determining annual energy production according to an embodiment of the invention.

FIG. 1 shows a flow chart that outlines a method 100 of determining annual energy production of a proposed wind farm, made up of a plurality of wind turbine generators, or more colloquially, wind turbines.

As will be understood from the term, a proposed wind farm is a planned wind farm whose construction has not yet begun or has not yet been completed. The proposed wind farm is a wind farm in the planning stages and whose performance and interaction with the wind at the proposed site for the wind farm needs to be understood before construction can proceed. However, despite the method being discussed in relation to proposed wind farms, it will be appreciated that the present method may also be applied to wind farms that have already been constructed for final planning stages of the wind farm, and may also be applied to wind farms that are currently operational, in order to investigate the effects of wind farm blockage on annual energy production in differing wind conditions and/or if changes are made to the wind farm layout and/or its modes of operation.

As will also be well understood by the skilled person, annual energy production is a well-known term in the field of wind power and wind power plants or farms. Annual energy production (AEP) is the total amount of energy output per year by the farm, typically measured in kilowatt hours or megawatt hours. Again, while the methods according to the embodiments described and claimed herein are for the determination of annual energy production, it will be appreciated that the methods may also be applied to the determination of other parameters used to measure wind farm performance such as the levelized cost of energy (LCOE) and in determining power curves.

Also used herein are the terms ‘wind direction’ and ‘wind speed’. Generally, where these terms are used to refer to modelling in the following description and are not accompanied by a clarifying term such as ‘adjusted’, these terms should be taken to be the freestream direction and speeds. The freestream direction and speed are the wind direction and wind speed that are used as inputs to models and are the direction and speed of the wind that has not been interfered with by obstacles in the model. During modelling, the wind direction and wind speed may change when interacting with modelled wind turbines, but the freestream direction and speed remain the same.

In the method 100 shown in FIG. 1, at step 102 a definition of a proposed wind farm is received. The wind farm definition includes the layout of the wind turbines that form the wind farm and the type of each wind turbine in the farm including information about dimensions, particularly rotor size. The type of wind turbine may additionally include information that may be generally relevant to the aerodynamic properties of the turbines.

For example, the tower height of the wind turbines may also be included in the wind farm definition. In some examples, the aerodynamic properties of the turbines include blade properties, such as detailed blade geometries, airfoil sections of the blades, lift and draft coefficients. In some examples, the aerodynamic properties may comprise operational properties, such as rotational speed of the turbine rotors, pitch settings of the blades, and other aerodynamic properties of the turbine specific to the flow field.

The layout of the proposed wind farm typically includes the layout of the turbines with respect to the terrain on which the wind farm will be sited. This information may be referred to as siting data. Topographical data and terrain type parameters may be utilised to model wind fields as appropriate. Parameters, including, for example, roughness length, may be used to model wind fields as appropriate. Input from weather modelling may also be used to define boundary conditions for the flow model simulations, such as the atmospheric boundary layer height and temperature gradients. At the very least, the wind farm definition defines the relative positions and spacings of the turbines and information about rotor size that can be used to model the wakes and interaction of the wind fields within the farm and around each turbine of the farm.

Using the wind farm definition, a model is created for use in the next steps of the method 100. In the examples shown in FIGS. 2 to 5, the model is a 2D model and is shown in plan view, but the model may alternatively be a model involving 3D elements, provided sufficient information is provided in step 102 to create this model. Any suitable model may be used to perform the modelling. For example, the model may be a model in which the wind turbines are modelled based on actuator disk theory. Actuator disk theory, also known as disc actuator theory, is discussed in chapters 4 and 5.1 of the textbook 'Wind Turbines: Fundamentals, Technologies, Application, Economics', $2^{nd}$ Edition, by Erich Hau.

After receipt of the definition, the method 100 effectively splits into two sub-routines or 'streams': a first stream, shown on the left-hand side of FIG. 1, in which the full wind field of the wind farm is modelled; and a second stream, shown on the right-hand side of FIG. 1, in which the locations of virtual masts for use in the modelled wind field are defined. Although depicted here as being two streams performed concomitantly, it will be appreciated that, as each stream is not dependent upon the output of the other stream, these streams may be performed at different times, with one stream being performed after the other, or so that there is some degree of overlap.

Considering initially the first stream, at step 104 of the method 100, modelling is performed to determine the wind field of the wind farm as a whole. The modelling can be any suitable method for modelling the wind field that models the wakes and turbine effects other than the wakes. For example, the method used may be a suitable computational fluid dynamics (CFD) simulation, such as a Reynolds-Averaged Navier Stokes (RAMS) simulation, or a Large Eddy Simulation (LES). The wind turbines within the farm may be modelled based on actuator disk theory.

The step 104 of modelling the wind field of the wind farm is performed for a plurality of wind speeds in each of a plurality of wind directions.

The plurality of wind speeds and the plurality of wind directions are a predetermined set of wind directions and wind speeds. Where a plurality of wind speeds and/or plurality of wind directions are referred to hereafter, these are the same wind speeds and wind directions that have been predetermined for use in step 104. This plurality of wind speeds and directions may be thought of as using a plurality of different wind loading conditions, or the use of a plurality of wind vectors. It is envisaged that the pluralities of wind speeds and wind directions will be chosen to provide enough wind speeds and wind directions so that appropriate adjustments can be made to on-site measurements of wind speeds and directions to allow determination of annual energy production for the wind farm.

Figure 2:
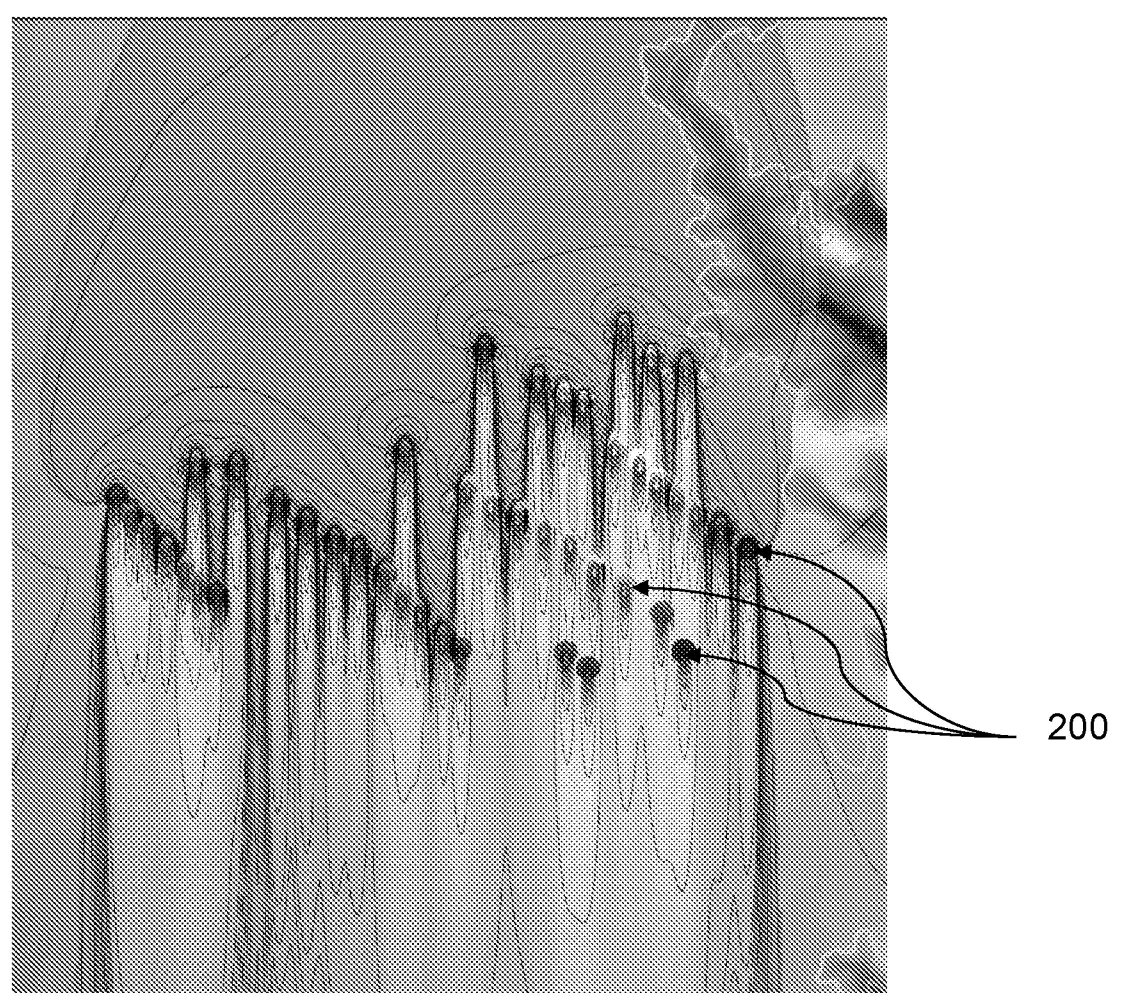
FIG. 2 shows a representation of a wind farm layout with modelled wind field.

The output of step 104 is a plurality of modelled wind fields for the wind farm as a whole, with the plurality of modelled wind fields including a wind field for each of the plurality of wind speeds in each of the plurality of wind directions. An example wind field modelled for a wind farm in one direction and for one, non-negligible wind speed is illustrated in FIG. 2. In FIG. 2 the wind turbines of the wind farm are generally referenced using the reference sign 200.

So, taking a simplified example to demonstrate this, the wind field of the wind farm may be modelled for each of the wind directions north, east, south, and west, and for wind speeds of 5 m/s, 10 m/s and 15 m/s in each wind direction, so that there are 12 wind speed and direction combinations and therefore 12 modelled wind fields output from step 104.

The second stream of the method 100 provides an output of locations of virtual measurement masts defined for use in the modelled wind fields output from the first stream.

There are three steps 106, 108, 110 in the second stream. In step 106, the wind farm is also modelled but, rather than the full wind field being modelled as in step 104, only the wakes of the wind farm are modelled instead. The wakes are modelled as the wakes of the farm are used in the later steps of the second stream. While this step is depicted as separate to the full wind field modelling of step 104, the modelling of the wakes performed in step 106 may form part of the modelling performed as part of step 104 in some embodiments.

The wakes of the wind farm are modelled to determine upstream turbines for use later in the second stream as well as for use in defining the locations of virtual measurement masts. The wakes of the farm are modelled for each of the plurality of wind speeds in each of the plurality of wind speeds. The plurality of wind speeds in each of the plurality of wind directions for which the wakes of the farm are modelled are the same plurality of wind speeds in the same plurality of directions for which the full wind field is modelled in step 104. In some embodiments, the steps 106, 108, 110 of the second stream may be performed for a subset of the plurality of wind speeds in each of the plurality of directions. For example, only one, non-negligible wind speed may be modelled for each of the plurality of directions so that, at the very least, the output of the second stream is one set of defined locations for virtual measurement masts in each wind direction.

As with step 104, the modelling used for step 106 can be any suitable method for modelling the wind field that models the wakes only. For example, the method used may be a suitable computational fluid dynamics (CFD) simulation, such as a Jensen (NOJ) wake model.

The wakes of the farm modelled in step 106 are used in step 108 to determine the upstream turbines to model. For each wind speed in each wind direction, the upstream turbines are identified as the turbines whose effective wind speed, in the wakes-only model, i.e. without any wind farm blockage or turbine blockage effects, is the freestream wind speed.

Once the upstream turbines have been identified for each wind speed in each of the wind directions, each individual turbine can be modelled, at step 108, for the wind speed and wind direction combinations for which that turbine is an upstream turbine, based on the output of step 106. In an alternative to what is shown in FIG. 1, in some embodiments the modelling of individual turbines, i.e. step 108, may be performed first for all turbines for all wind directions and wind speeds, and the wakes-only modelling may be subsequently or concomitantly performed to determine which of the modelled turbine wind fields to use as the upstream turbine wind fields.

Modelling wind fields of individual turbines, specifically the upstream turbines relative to the freestream wind direction and wind speed, enables the subsequent determination of a clearance from the turbines to avoid the region around each turbine in which turbine blockage effects of the turbine are present. Quantified turbine blockage effects are already used to adjust measured wind speeds in the determination of AEP so the duplication of these effects when considering wind farm blockage should be avoided. Of course, in some embodiments, the two effects may be combined and quantified together.

In some embodiments, the modelling of the wakes of the wind farm and the individual turbine wind fields, steps 106 and 108, are optional steps. In other embodiments the individual turbine blockage effects may be determined and/or estimated by other means.

As noted, the modelled wind fields of individual turbines are used to determine turbine blockage effects caused by the turbine. In determining turbine blockage effects, a position for virtual masts upstream of the upstream turbines can be determined so that wind farm blockage can be quantified without interference or overlap with the effects of individual turbine blockage.

At the next step 110 of the method 100, the locations of the virtual measurement masts are defined based on the modelled individual wind field of the turbines and the modelled wakes of the farm, in other words the outputs of steps 106 and 108.

These locations of virtual measurement masts are defined so that the virtual measurement masts can be placed in the modelled wind fields of the wind farms that correspond to the wind direction and wind speed for which the locations were defined in order to identify the effects of wind farm blockage.

The step 110 of defining the locations of the masts is therefore important to ensure that the correct locations are chosen to effectively observe the wind farm blockage without the interference of other wind turbine effects such as turbine blockage.

As a result of step 110, a plurality of virtual measurement mast locations are defined for use in the modelled wind fields of the wind farm. The locations of the virtual measurement masts are defined for each of the plurality of wind speeds in each of the plurality of wind directions, although as has already been noted the locations may be defined based on direction alone.

The definition of the locations will be discussed in detail with respect to FIGS. 3 to 5 after the method 100 of FIG. 1 has been followed to completion.

Having defined locations for the virtual measurement masts, the wind farm blockage is quantified. At the next step 112 of the method 100, a wind farm blockage factor is determined for each of the plurality of wind speeds in each of the plurality of wind directions. The wind farm blockage factor is based on the reduction in freestream wind speed observed at the virtual measurement masts located in the modelled wind field for the wind farm. The wind farm blockage factor may be an average wind speed reduction from the freestream wind speed measured across the virtual measurement mast locations per direction and speed, or may be a percentage reduction to apply to measured wind speeds. It should be noted that the virtual measurement masts are arranged in the wind field to provide a point measurement of wind speed at a height corresponding to the centreline of the rotors of the upstream wind turbines.

For example, the wind farm blockage factor may be determined by determining a reduction in freestream wind speed at each of the virtual measurement masts in the modelled wind field for each wind speed and wind direction. The reduction is typically in the form of a difference in wind speed between the freestream wind speed and the wind speed at the virtual mast. For each wind speed and wind direction pair, a plurality of wind speed reductions are generated, corresponding to one reduction for each virtual mast. The plurality of wind speed reductions are averaged to determine a wind farm blockage factor. In other words, for each wind speed and direction, the wind farm blockage factor may be the average of the wind speed reductions at each of the virtual masts. The average may be a mean value of all of the differences. Alternatively, the average may be a weighted average, with the weighting taking the location of the mast into account. For example, masts that are not directly upstream of a turbine may be weighted less than masts directly upstream of a turbine.

In some examples, rather than the wind farm blockage factor being a value for an average wind speed reduction, the blockage factor may be an average percentage reduction or an average normalised reduction. In other words, the blockage factor may be the value gained by dividing the difference by the freestream wind speed or the value of the wind speed measured by the virtual masts divided by the freestream wind speed. In each case, once again, an average value may be taken as the wind farm blockage factor.

The wind farm blockage factors obtained in step 112 are used to determine the annual energy production of the farm. To determine annual energy production, adjusted on-site wind speeds are determined. In step 114 of the method 100, measurements are taken at the physical site of the proposed wind farm using physical measurement masts positioned at predetermined locations. Measurements are received from the physical measurement masts at step 114 in order to determine average wind speeds and directions across the site.

These wind speeds and directions are processed in step 116 of method 100 where they are adjusted based on the wind farm blockage factor that is relevant to the wind direction. For example, if the freestream wind speed is 15 m/s in a northerly wind direction, and the wind farm blockage factor for that wind speed and wind direction, based on the calculations, is determined to be equivalent to a 0.5 m/s reduction in wind speed, then any measurements received from the physical measurement masts for the northerly direction indicating a wind speed of 15 m/s are adjusted by the 0.5 m/s reduction so that an adjusted wind speed is obtained. Once all measurements made by the physical measurement masts have been adjusted, step 116 is performed, and an AEP is determined based on the adjusted wind speeds.

Where the adjustment is based on a percentage value, each wind speed and direction may be adjusted by the percentage value. For example, where the wind farm blockage factor is 6%, meaning there is a 6% reduction in the freestream wind speed due to wind farm blockage, the resulting adjusted wind speeds are 94% of their original values.

The AEP may be determined using any suitable method. For example, AEP determination may use a method such as that used by particular certification and accreditation bodies in the field of renewable energy and particularly wind energy. For example DNV-GL's AEP determination method uses the following steps:

- perform a long term correction of measurements obtained by a measurement mast at the proposed site using a long (20 years or more) time series of mesoscale and/or a weather model;
- calculate climate statistics for each of a plurality of designated wind sectors and for each of a plurality of wind speed ranges or 'bins';
- determine a generalized climate using a flow model based on the climate statistics;
- choose turbine type and location of those turbines for proposed site;
- compute the wake effects and other losses of the farm; and
- determine net annual energy production of the farm based on the generalized climate, the turbine types and location, and the losses.

The adjusted wind speeds may be incorporated into the above calculation at a number of different positions, including at the first step, by correction of the mast measurements, at the second or third steps, between the first and second steps, or as an additional losses in the step of 'compute the wake effects and other losses of the farm'. The adjusted wind speeds may be incorporated as an additional input to the final step.

For example, if the wind farm blockage is used to correct mast measurements, the wind speed blockage factor is subtracted from (where the factor is a wind speed reduction value) or used to adjust (where the factor is a percentage reduction) the wind speed measured in each of a plurality of observation periods, typically 10 minutes long, for the corresponding wind speed and wind direction bin.

In a specific example, a measurement mast at the proposed site may make a plurality of measurements in 10 minute observation periods. The measurement mast may, in one timestamped 10 minute observation period, determine that the measured wind speed is 16.22 m/s and that the wind direction is 260.17 degrees. Based on the method described herein for determining wind farm blockage factor, it may have been determined that for the direction and speed bins that these values fall into, a percentage reduction of 0.51% is to be applied as the blockage factor. Therefore, the adjustment of the measured wind speed is made to reduce 16.22 m/s by 0.51%, giving an adjusted wind speed of 16.12 m/s. This is repeated for each timestamped observation period and for each mast measurement.

In the final step of 'determine net annual energy production of the farm', the method may comprise fitting a Weibull distribution to the time series of wind speed values that have been corrected. This obtains a blockage-corrected sector-wise scale and shape factor of the wind distribution, i.e. the size and direction, which includes a respective frequency of occurrence of the wind speed and direction.

This is applied to the model of the site including the turbines and their power characteristics to determine individual turbine output values. These can be summed to provide a plant power output.

Generally, the hourly energy production of a turbine can be determined by summing over direction and wind speed the product of the individual power outputs and frequency of occurrence for each speed and direction. The sum of all outputs of the turbine multiplied by 24 and 365 then provides annual energy production.

The general method for determining the AEP, without taking wind farm blockage into account, would be familiar to the skilled person.

Figure 3:
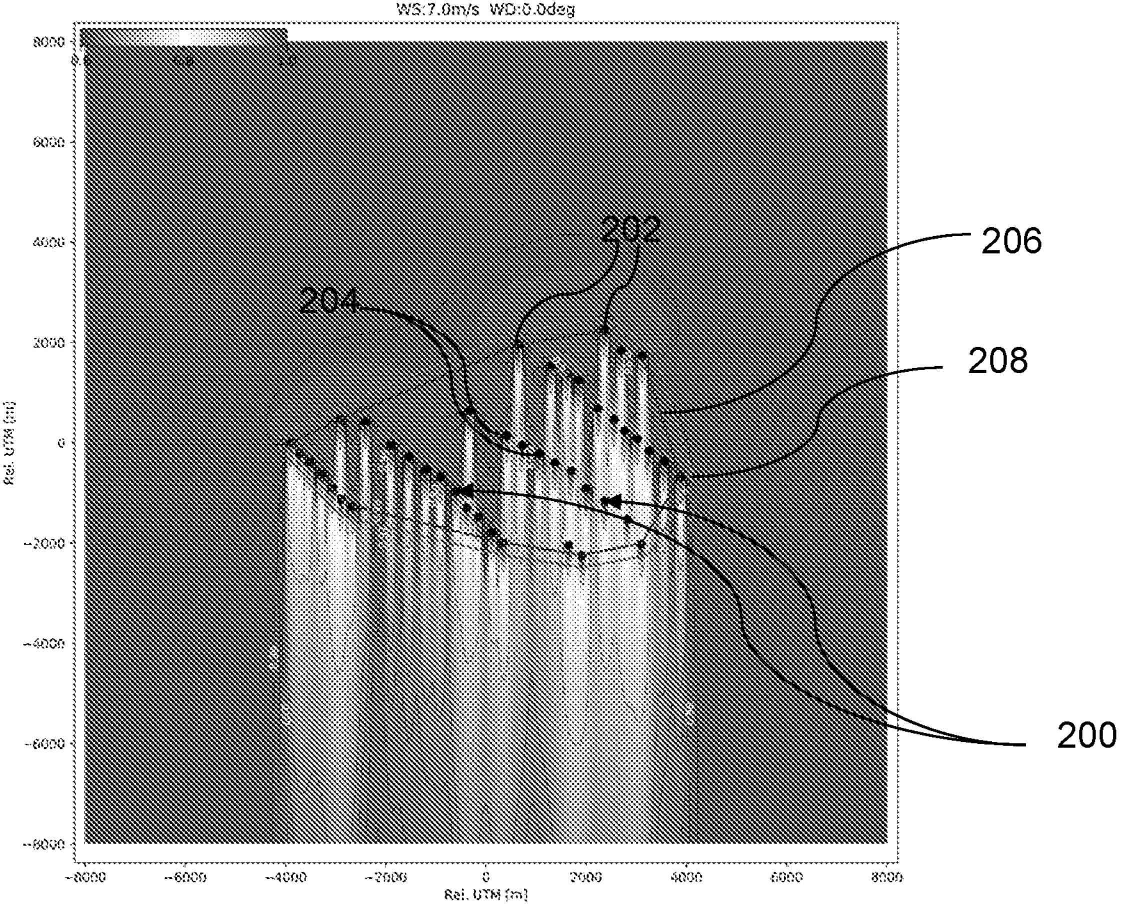
FIG. 3 shows the wind farm layout of FIG. 2 at a point of a process for defining locations for the virtual measurement masts.
Figure 4:
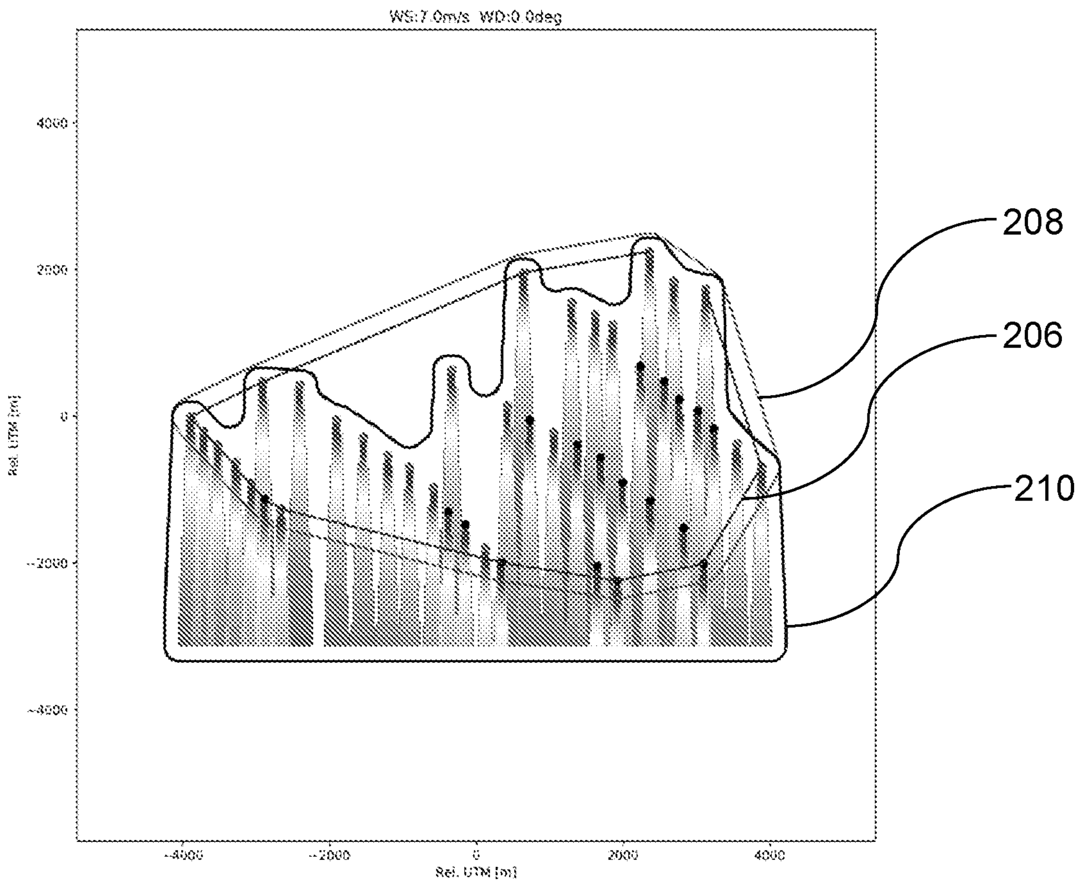
FIG. 4 shows the wind farm layout of FIG. 2 at a later point of a process for defining locations for the virtual measurement masts.
Figure 5:
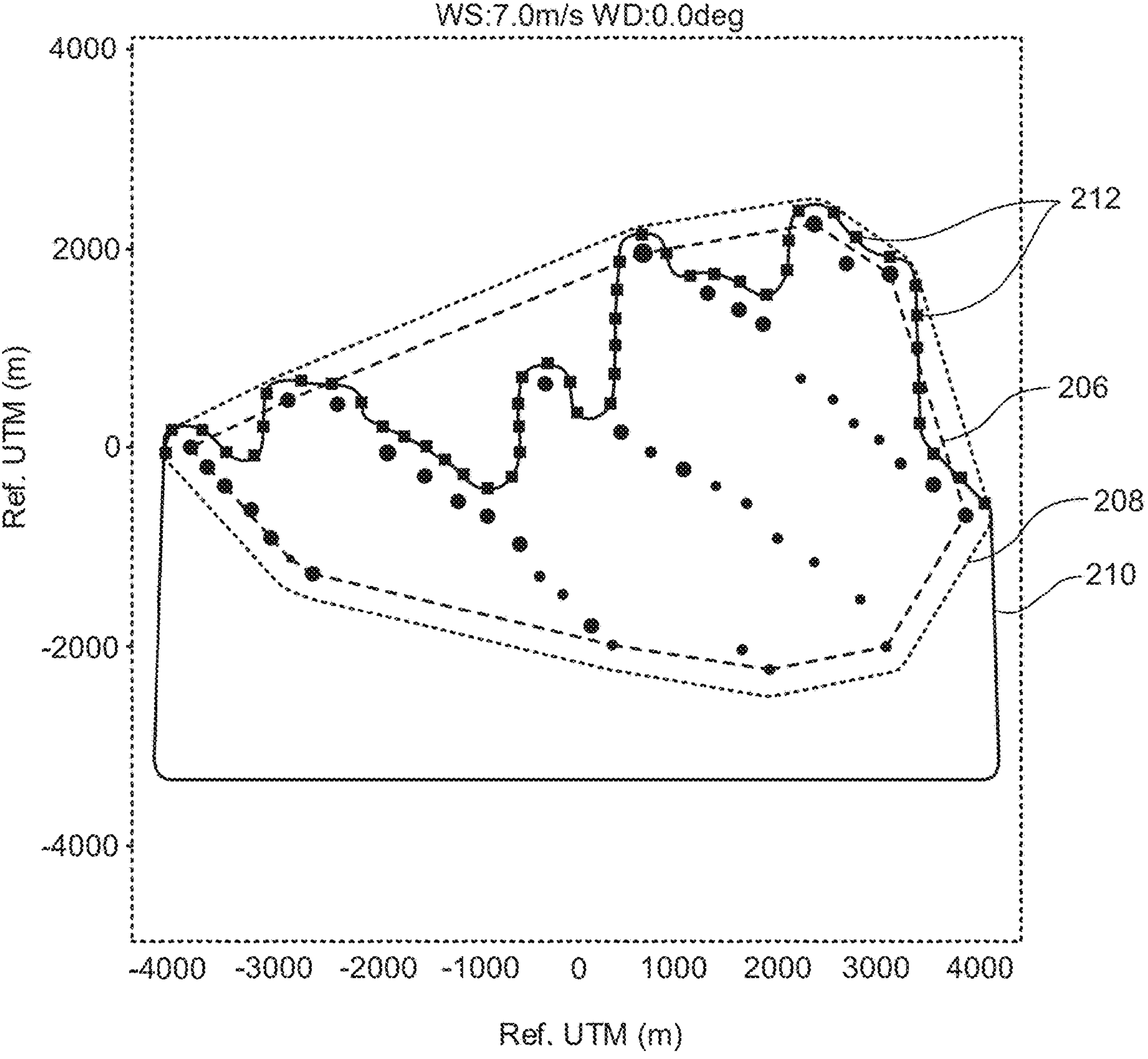
FIG. 5 shows the wind farm layout of FIG. 2 at a yet later point of a process for defining locations for the virtual measurement masts, illustrating the positions of virtual masts for quantification of the wind farm blockage.

FIGS. 3 to 5 illustrate how, according to an embodiment, the locations may be defined, at step 110 of the method of FIG. 1. As will be appreciated, the definition of locations as explained in relation to FIGS. 3 to 5 is only one way in which the locations may be defined and is provided by way of explanation only. The definition of mast locations may be performed according to other methods in other embodiments.

Step 110 is performed to define locations for virtual measurement masts to be placed within the model of the whole farm simulated at step 104. Having received the wind farm definition, so that the size and location of the wind turbine generators of the farm are already known, an arrangement of the wind turbines in the farm can be generated. In FIGS. 3 to 5 the individual turbines 200 are represented by black dots.

As noted above, the upstream turbines for each of the plurality of wind speeds in each of the plurality of wind directions, have been identified. For ease of explanation, FIGS. 3 to 5 show the calculation performed for only one wind speed in one direction. In FIGS. 3 to 5, the wind direction is vertically down the figure from the top to the bottom. For this wind direction and wind speed, the upstream turbines that were identified in previous steps of the second stream are highlighted as enlarged dots 202 compared to the non-upstream turbines 204.

Initially, a boundary around the upstream turbines at a maximum clearance is determined to indicate a limit on where wind farm blockage effects can be assessed. The maximum clearance is used to ensure that virtual masts are not placed outside the region in which wind farm blockage effects occur, so that the readings for use in assessing AEP quantify the wind farm blockage as accurately as possible.

To define the boundary at the maximum clearance, a first boundary 206 connecting an outer set of the upstream turbines is generated, as shown in FIG. 3. In FIG. 3, the wind farm, whose turbines are indicated using black dots 200, is depicted with a wind field around the turbines, which is used to determine later boundaries. The first boundary 206 in this example is a convex hull generated for the upstream turbines. The hull is generated using a hull-generating algorithm. A convex hull is a geometry that surrounds all the points within the set, which is the upstream turbines, without introducing any acute angles to give a smooth polygon around the points. In other words, the first boundary 206 connects the upstream turbines at the edges of the wind farm.

As can also be seen in FIG. 3, a second boundary 208 is generated, this second boundary 208 being the boundary at maximum clearance. The second boundary 208 is the same shape as the first boundary 206 but with an increased size so that it is at a set distance at all points from the first boundary 206. The set distance is typically a multiple of the diameter of the turbine rotors, such as four times the diameter of the rotors.

The maximum clearance is a distance from turbines of the farm beyond which no or negligible wind farm blockage effects are expected to be identified. This may be quantified by assessing where wind farm blockage effects are expected to fall below a predetermined threshold, or where the wind speed is within a predetermined threshold of the freestream wind speed. In other words, the maximum clearance may be set as the distance at which the wind speed upstream of the upstream turbines is considered to be within a threshold of the freestream value. In some examples, this may be within 1% of the freestream value. Effectively, therefore, the second boundary 208 defines a zone in which the virtual measurement masts should be placed.

As can be seen in FIG. 4, a further boundary 210 is created that surrounds the wind farm and substantially surrounds its wakes, the wakes having been determined for the direction and speed in step 106. The wakes are shown in FIG. 4 for illustration of how they are surrounded by the further boundary 210. This further boundary 210 is generated to exclude wakes, and surrounds the wakes of the farm. The further boundary 210 is also spaced from each of the upstream turbines by at least a predetermined clearance that is beyond the region in which turbine blockage effects are present. This predetermined clearance is the clearance determined based on the wind fields of the individual turbines in step 108 of the method of claim 1.

The further boundary 210 is generated so that it traces a line relative to each of the upstream turbines and is generated as a concave hull using a hull generating algorithm. The concave hull is generated at the predetermined clearance from the upstream turbines, so that the concave hull effectively generates a polygon that traces an upstream boundary around the turbines with smoothed angles. Therefore, as can be seen, there are some turbines that are not included in the first boundary, but that are visited closely by the further boundary.

Finally, as can be seen in FIG. 5 in which no wind field or wakes are shown, locations 212 for virtual masts are defined at a predetermined spacing along the part of the further boundary 210 that lies within the second boundary 208. The virtual mast locations 212 are defined along this part of the further boundary 210 as it is the location relative to the upstream turbines at which wind farm blockage effects will be experienced. Typically, the generation of the convex hull around the upstream turbines and the concave hull at the predetermined clearance, the locations being defined along the part of the concave hull within the convex hull, results in a set of virtual mast locations that extend along the front of the upstream turbines and between the outermost upstream turbines, so that the whole of the upstream part of the wind farm is covered and the wind farm blockage effects across the entire farm can be quantified.

In the present embodiment, to determine the predetermined clearances from the upstream turbines that are used to determine the positioning of the concave hull, turbine blockage effects of the individual turbines are quantified. In other embodiments, the clearances may be determined as a predetermined distance upstream of each upstream turbine, such as a set value or a multiple of the diameter of the rotor from the turbine, or may be determined by otherwise quantifying the turbine blockage effects. If a multiple of the diameter of the rotor from the turbine is used as the predetermined distance, the clearance may be set at 1.5 times the diameter (1.5D), 2D, 2.5D and/or 3D. Typically, it is expected that 2D is a suitable clearance for avoiding turbine blockage effects.

In the method 100 of FIG. 1, the step 110 of defining locations includes the determination of a clearance from each upstream turbine based on the modelled wind fields of the individual turbines. As already noted, the modelling of wind fields of upstream turbines is used in step 108 to enable the clearance to be determined. The modelling of wind fields around individual turbines enables turbine blockage effects and wake effects to be identified, without the presence of wind farm blockage because wind farm blockage is a phenomenon seen only with entire farms.

Figure 6:
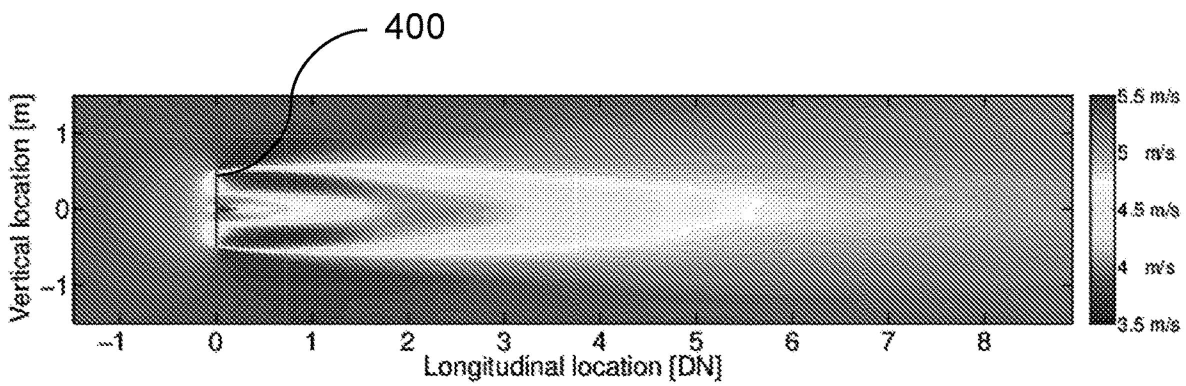
FIG. 6 shows a representation of an individual wind turbine with a modelled wind field.

An example of a modelled wind field for a wind turbine 400 is shown in FIG. 6. In this example wind field, it can be seen that slightly ahead of the wind turbine 400 there is a slower wind speed than the freestream wind speed, which in this example is normalised. The wind speed in front of the turbine 400 is affected by turbine blockage effects, leading to a slower wind speed than the freestream wind speed. Accordingly, when determining a clearance for virtual measurement masts, the turbine blockage effects need to be avoided. Therefore, the clearance for each upstream turbine can be determined by identifying a distance from that upstream turbine at which the wind speed is within a certain threshold from the freestream wind speed. Beyond this point, wind farm blockage will be the dominant loss factor when simulating the wind field of the wind farm as a whole, so this region, beyond the turbine blockage effects but not too far from the wind field, is the region in which virtual measurement masts are ideally placed.

Figure 7:
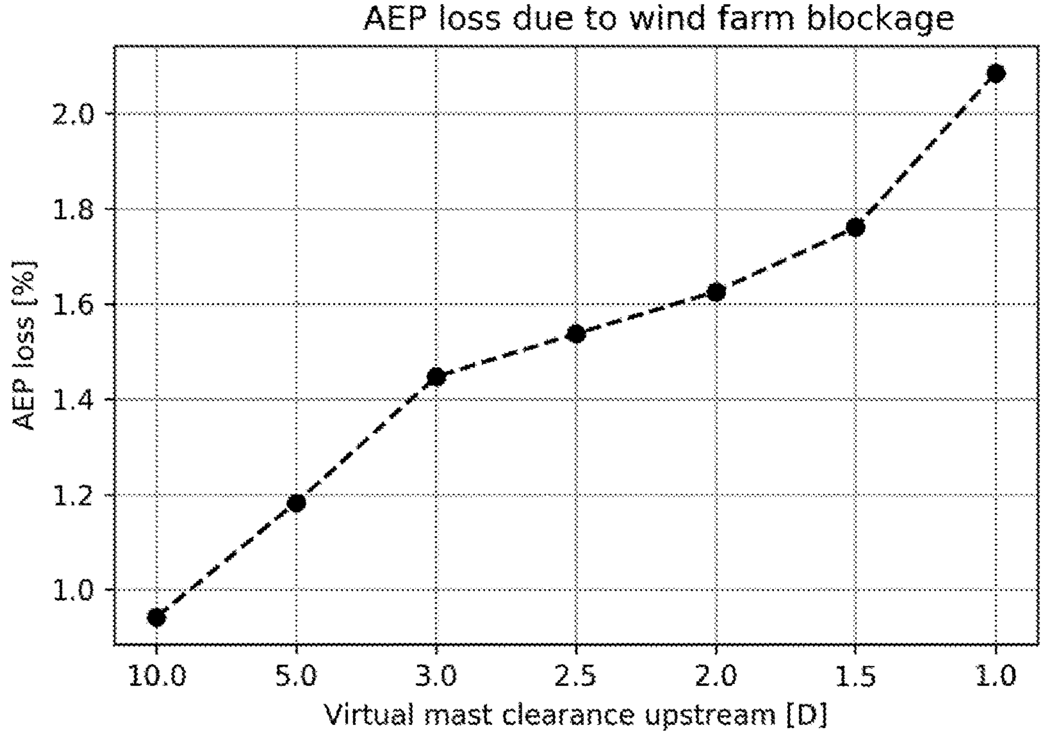
FIG. 7 shows a chart showing the relationship between the distance of masts from upstream turbines and loss in annual energy production.
Figures 8A, 8B, 8C, 8D, 8E:
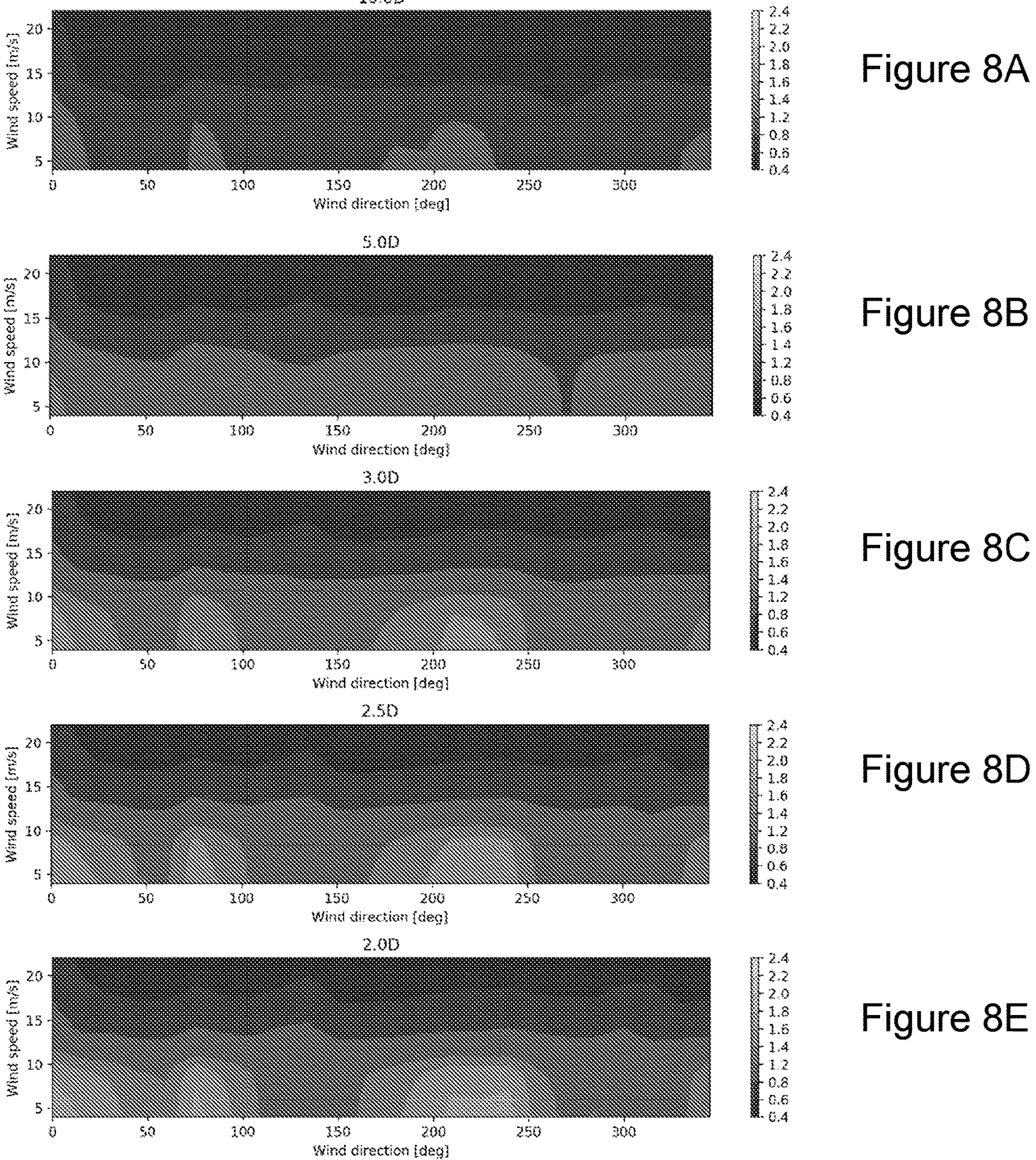
FIGS. 8A to 8G show a set of charts showing the relation of wind speed to wind direction measured at distances from the upstream turbines.
Figures 8F, 8G:
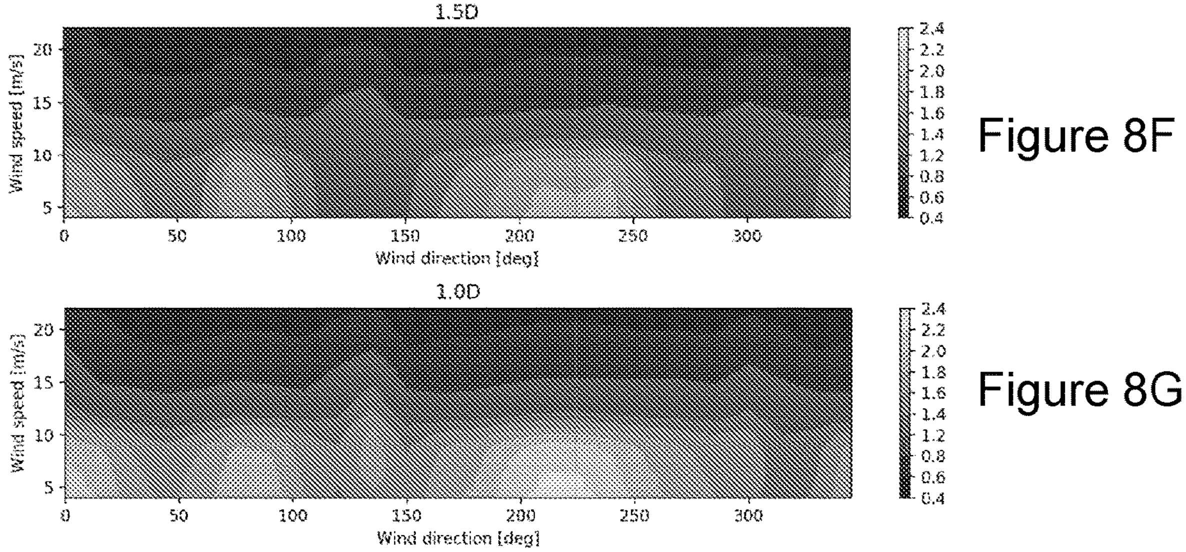

As can be seen in FIG. 7, which shows a chart of percentage loss in annual energy production (AEP) compared to a clearance distance of virtual measurement masts in terms of diameters of the turbines, the AEP loss is higher at smaller diameter distances from the turbines. As noted above, masts placed closer to the turbines are measuring turbine blockage effects as well as wind farm blockage effects. Therefore, to quantify wind farm blockage effects alone, the optimum locations for virtual measurement masts is beyond the region in which turbine blockage effects are seen. In this example, the region is between approximately 2D and 3D.

FIGS. 8A to 8G show example charts used in the determination of AEP in the method of FIG. 1. FIG. 8A to 8G are charts of wind speed against wind direction, showing the effect of wind farm blockage. Each of charts 8A to 8G illustrates a different clearance for the virtual masts from the upstream turbines. The clearances of FIGS. 8A to 8G are 10D, 5D, 3D, 2.5D, 2D, 1.5D, and 1D respectively, where D is the diameter of the rotor of the upstream turbines.

The charts illustrate blockage percentages for each wind speed and direction at the particular clearances. Blockage percentage is the percentage by which the wind speed is reduced, as defined by the virtual mast aggregates values over the plurality of free stream wind speed conditions and directions. The blockage percentage shown in FIGS. 8A to 8G illustrates the non-uniformity of the blockage effect at different wind speeds and for different directions. FIGS. 8A to 8G also indicate that the minimum blockage is exhibited at higher wind speeds, as a consequence of lower thrust coefficient throughout the wind farm.

Also visible in FIGS. 8A to 8G is the effects of blockage at lower wind speeds as the virtual masts are placed closer to the wind farm. Typically, a clearance of two to three rotor diameters is expected to be far enough from the wind farm for turbine blockage to be negligible, and it is clear from FIGS. 8C to 8E, which show clearances of 3D, 2.5D, and 2D respectively. Closer to the turbine, higher blockage percentages are seen, which include turbine blockage effects.

In some embodiments, the wind farm blockage factor is determined based on an average wind speed reduction across each of the virtual measurement masts for each wind speed in each wind direction, the average being the average of each wind speed reduction measured by each virtual measurement mast relative to the freestream wind speed. In some embodiments, a weighting may be applied to each or some of the individual reductions from a virtual measurement mast based on the proximity of the virtual measurement mast to the nearest turbine. The nearest turbine may be the nearest upstream turbine that is directly downstream from the virtual measurement mast location, or may be the nearest turbine more generally. In some embodiments, a weighting may be applied based on other factor such as proximity to one or more turbines, proximity to one or more other virtual measurement masts and/or the number of turbines directly downwind of the virtual measurement mast from which the reduction measurement is taken. This would result in improved accuracy in the blockage quantification.

Additionally or alternatively to the provision of weightings for the reductions, planar surfaces may be defined for the virtual mast measurements so that planar averaged wind velocities are obtained rather than point measurements.

In some embodiments, the planar surface may comprise a ribbon, comprising a vertical planar surface having a width corresponding to the diameter of the rotors of the upstream turbines and aligned with the top and bottom positions of the rotors. The ribbon spans and extends through all the virtual masts, and provides a surface across which a planar average wind speed can be estimated for each of the virtual measurement masts. This would result in an improved accuracy in determining the wind field and reductions due to wind farm blockage.

In some embodiments, the planar surface may comprise a plurality of discs. The discs are vertically arranged at the defined positions of the virtual measurement masts. The discs may have a diameter equal to or greater than the diameter of the rotor of the nearest upstream turbine downstream of the virtual measurement mast disc. The discs may also be aligned with upstream turbines that are downstream of them.

In some embodiments, non-planar surfaces may be utilised. For example, given that the wind farm blockage effects change with proximity to the wind field, a box may be defined that has a volume relative to the virtual mast positions and so extends both vertically and horizontally relative to the virtual measurement masts.

Alternative planar surfaces may also be utilised. It will be appreciated that any discussion of virtual measurement masts herein comprises both the concept of point measurements within the wind field and averaged measurements across a surface, be it planar or otherwise. In some embodiments, point measurements and averaged surface measurements may be suitably combined.

Figure 9:
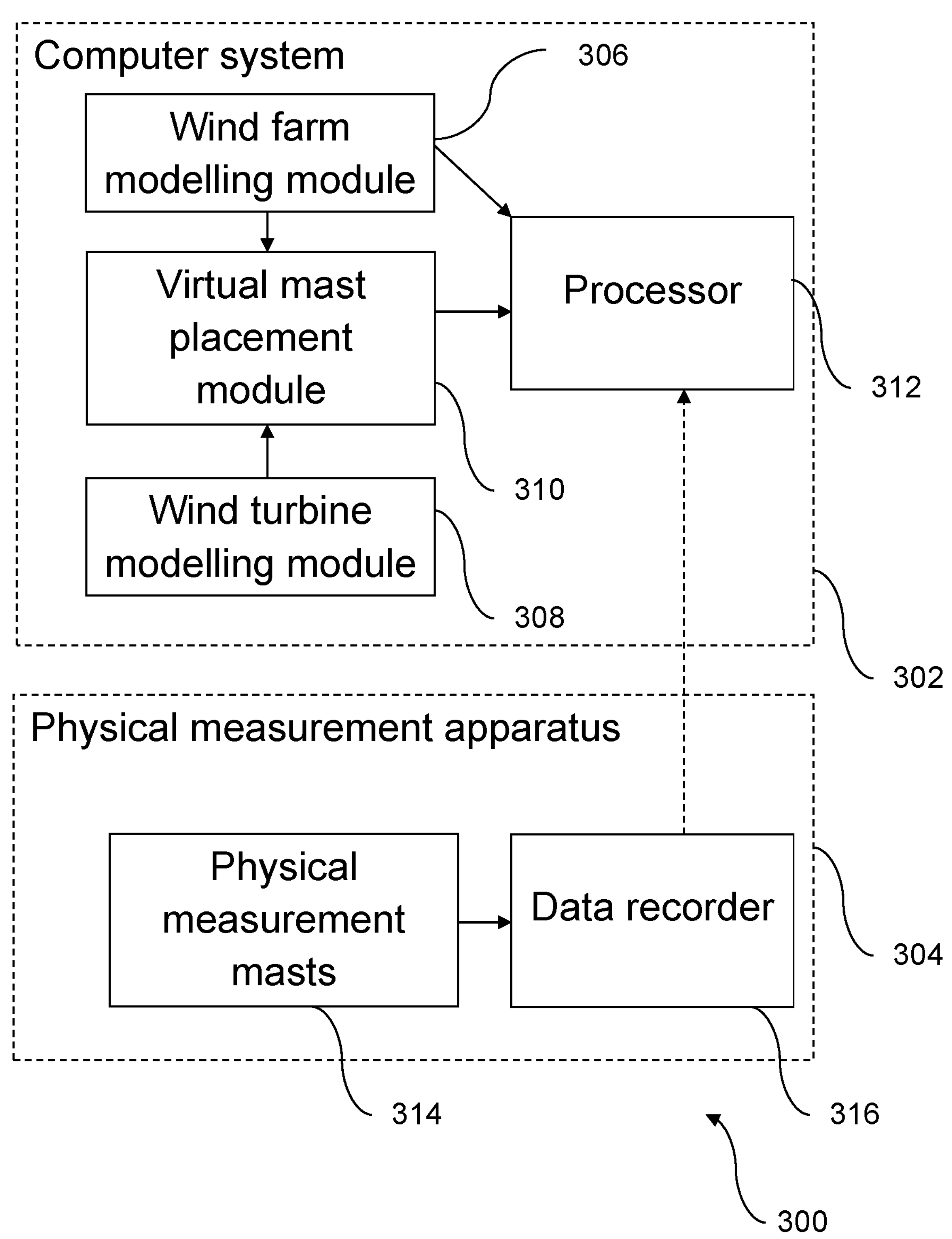
FIG. 9 shows a system for performing the method of FIG. 1.

The above methodology may be implemented using a system 300 as shown in FIG. 9. The system 300 comprises a computer system 302 and physical measurement apparatus 304. The computer system 302 comprises a wind farm modelling module 306 configured to perform modelling of wind fields and wakes-only fields of the wind farm, a wind turbine modelling module 308 configured to perform modelling of wind fields of the wind turbines of the wind farm, a virtual measurement mast placement module 310 configured to define locations for a plurality of virtual measurement masts, and a processor 312 for receiving the models, locations, and physical measurements to determine wind farm blockage factors and AEPs. The physical measurement apparatus 304 comprises a plurality of physical measurement masts 314 for location at the site of the proposed wind farm and at least one data recorder 316 connected to the physical measurement masts 314. Data recorded by the data recorder 316 may be transferred to the processor 312 via a communications network such as the internet, via a removable storage device, or by direct connection between the processor and the recorder.

It will be appreciated that various changes and modifications can be made to the present Invention without departing from the scope of the present application.

The invention claimed is:

1. A method for determining annual energy production of a proposed wind farm, the method comprising:

disposing a plurality of physical measurement masts at a site of the proposed wind farm;

connecting the physical measurement masts to a data recorder;

receiving a definition of the proposed wind farm, the definition including at least a layout of a plurality of wind turbines of the wind farm at a predetermined site and rotor size of each of the plurality of wind turbines;

modelling a wind field of the wind farm for each of a plurality of freestream wind speeds in each of a plurality of wind directions;

defining locations for a plurality of virtual measurement masts upstream of upstream turbines in each of the plurality of wind directions, wherein the upstream turbines are defined relative to the wind direction and the locations are defined at a horizontal distance from each upstream turbine for identifying wind farm blockage effects;

determining a wind farm blockage factor for each of the plurality of freestream wind speeds in each of the plurality of wind directions, the wind farm blockage factor being based on wind speed data from the plurality of virtual measurement masts located in the modelled wind field at the locations defined for the wind direction;

receiving a plurality of measurements indicating wind speed and wind direction from the plurality of physical measurement masts; and determining an annual energy production for the proposed wind farm based on one or more adjusted wind speeds obtained by applying one or more determined wind farm blockage factors to one or more measurements from the plurality of physical measurement masts.

2. The method of claim 1, wherein the horizontal distance from each upstream turbine is a predetermined value.

3. The method of claim 1, wherein the horizontal distance from each upstream turbine is based on the diameter of a rotor of the upstream turbine.

4. The method of claim 3, wherein the horizontal distance from each upstream turbine is 1, 1.5, 2, 2.5, or 3 times the diameter of the rotor of the upstream turbine.

5. The method of claim 1, further comprising modelling the wind field of each upstream turbine separately from the other turbines of the wind farm for each of the plurality of freestream wind speeds in each of the plurality of wind directions, wherein the horizontal distance from each upstream turbine of the wind farm for identifying wind farm blockage effects is based on the modelled wind field of each upstream turbine.

6. The method of claim 5 further comprising determining, from the modelled wind field of each upstream turbine, a position upstream of the upstream turbine at which the wind speed is within a predetermined threshold of one of the plurality of freestream wind speeds, and wherein the horizontal distance is determined as a horizontal distance from the position to the upstream turbine.

7. The method of claim 5 further comprising modelling the wakes of the wind farm for each of the plurality of freestream wind speeds in each of the plurality of wind directions, and wherein the upstream turbines are determined as the turbines in the farm whose incident wind speed is one of the plurality of freestream wind speeds.

8. The method of claim 1, wherein defining locations for a plurality of virtual measurement masts comprises:

generating a line upstream of the upstream turbines at the determined horizontal distances, the line surrounding the outermost upstream turbines; and defining the locations along the generated line.

9. The method of claim 8, further comprising modelling the wakes of the wind farm for each of the plurality of freestream wind speeds in each of the plurality of wind directions and wherein generating the line comprises:

generating a convex hull at a predetermined horizontal distance from the upstream turbines, the predetermined horizontal distance being a horizontal distance outside which no wind farm blockage effects are expected to occur, wherein the convex hull has a geometry that surrounds all the upstream turbines, at the predetermined horizontal distance, without introducing any acute angles to give a smooth polygon around the upstream turbines;

generating a concave hull surrounding the upstream turbines and the modelled wakes of the wind farm, the concave hull being spaced at the determined horizontal distances from the upstream turbines and a distance from the wakes of the wind farm, wherein the concave hull has a geometry shaped as a polygon that traces an upstream boundary, at the determined horizontal distances, around the upstream turbines with smoothed angles; and defining the line as a part of the concave hull that is within the convex hull.

10. The method of claim 8, wherein the locations are defined at regular intervals along the line.

11. The method of claim 1, wherein determining the wind farm blockage factor comprises determining an average wind speed reduction for the wind direction and wind speed, wherein the blockage factor is based on the average wind speed reduction.

12. The method of claim 11, wherein the average wind speed reduction is determined by calculating a reduction in the wind speed between the freestream and measured wind speeds at the position of each of the plurality of virtual measurement masts and determining the average wind speed reduction based on the calculated reductions.

13. The method of claim 12, wherein determining the average wind speed reduction comprises applying a weighting to each reduction based on a proximity of the virtual measurement mast to a nearest turbine.

14. The method of claim 13, wherein the nearest turbine comprises the nearest upstream turbine that is downstream of the virtual measurement mast.

15. The method of claim 1, wherein the wind speed data from the plurality of virtual measurement masts comprises at least one of point measurement data obtained at each location and measurement data averaged over one or more surfaces associated with the locations.

16. The method of claim 1, wherein modelling the wind field of the wind farm for each of a plurality of freestream wind speeds in each of a plurality of wind directions is performed using a computational fluid dynamics (CFD) simulation.

17. A system, comprising:

a physical measurement apparatus comprising a plurality of physical measurement masts for location at a site of a proposed wind farm and at least one data recorder connected to the physical measurement masts;

a computer system communicatively coupled with the data recorder and being arranged to:

receive a definition of the wind farm, the definition including at least a layout of a plurality of wind turbines of the wind farm at a predetermined site and rotor size of each of the plurality of wind turbines;

model a wind field of the wind farm for each of a plurality of freestream wind speeds in each of a plurality of wind directions;

define locations for a plurality of virtual measurement masts upstream of upstream turbines in each of the plurality of wind directions, wherein the upstream turbines are defined relative to the wind direction and the locations are defined at a horizontal distance from each upstream turbine for identifying wind farm blockage effects;

determine a wind farm blockage factor for each of the plurality of freestream wind speeds in each of the plurality of wind directions, the wind farm blockage factor being based on wind speed data from the plurality of virtual measurement masts located in the modelled wind field at the locations defined for the wind direction;

receive, from the data recorder, a plurality of measurements indicating wind speed and wind direction from at least one of the physical measurement masts located at the site of the wind farm; and determine an annual energy production for the wind farm based on one or more adjusted wind speeds obtained by applying one or more determined wind farm blockage factors to one or more measurements from the physical measurement masts.

18. A method for determining annual energy production of a proposed wind farm, the method comprising:

receiving a definition of the proposed wind farm, the definition including at least a layout of a plurality of wind turbines of the wind farm at a predetermined site and rotor size of each of the plurality of wind turbines;

modelling a wind field of the wind farm for each of a plurality of freestream wind speeds in each of a plurality of wind directions;

defining locations for a plurality of virtual measurement masts upstream of upstream turbines in each of the plurality of wind directions, wherein the upstream turbines are defined relative to the wind direction and the locations are defined at a horizontal distance from each upstream turbine for identifying wind farm blockage effects;

determining a wind farm blockage factor for each of the plurality of freestream wind speeds in each of the plurality of wind directions, the wind farm blockage factor being based on wind speed data from the plurality of virtual measurement masts located in the modelled wind field at the locations defined for the wind direction;

receiving a plurality of measurements indicating wind speed and wind direction from at least one physical measurement mast located at the site of the proposed wind farm;

determining an annual energy production for the proposed wind farm based on one or more adjusted wind speeds obtained by applying one or more determined wind farm blockage factors to one or more measurements from the at least one physical measurement mast; and constructing a physical wind farm comprising the plurality of wind turbines according to the layout of the plurality of wind turbines.

* * * * *